United States Patent
Usami

(10) Patent No.: US 7,488,674 B2
(45) Date of Patent: Feb. 10, 2009

(54) SEMICONDUCTOR DEVICE AND MANUFACTURING METHOD THEREOF

(75) Inventor: Tatsuya Usami, Kanagawa (JP)

(73) Assignee: Nec Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/892,923

(22) Filed: Aug. 28, 2007

(65) Prior Publication Data

US 2008/0070400 A1    Mar. 20, 2008

Related U.S. Application Data

(62) Division of application No. 11/047,576, filed on Feb. 2, 2005, now Pat. No. 7,291,911.

(30) Foreign Application Priority Data

Feb. 3, 2004    (JP)    ............................. 2004-026666

(51) Int. Cl.
   *H01L 21/44*    (2006.01)
(52) U.S. Cl. .................. 438/613; 438/597; 438/598; 257/678; 257/686
(58) Field of Classification Search .......... 438/597, 438/598, 613, 622; 257/678, 686, 690, 693, 257/723
   See application file for complete search history.

(56) References Cited

U.S. PATENT DOCUMENTS

| | | | | | |
|---|---|---|---|---|---|
| 5,488,246 | A | * | 1/1996 | Hayashide et al. | 257/336 |
| 6,129,613 | A | * | 10/2000 | Bothra | 451/66 |
| 6,130,119 | A | | 10/2000 | Jinnai | |
| 6,432,810 | B1 | * | 8/2002 | Tseng | 438/618 |
| 6,445,072 | B1 | * | 9/2002 | Subramanian et al. | 257/758 |
| 6,818,546 | B2 | | 11/2004 | Saito et al. | |

FOREIGN PATENT DOCUMENTS

JP    10-223833    8/1998

* cited by examiner

*Primary Examiner*—Phuc T Dang
(74) *Attorney, Agent, or Firm*—McGinn IP Law Group, PLLC

(57) ABSTRACT

When forming a silicon nitride film to protect and insulate a surface on which a silicon substrate has been ground or polishing, by use of a mixed gas containing $SiH_4$, $N_2$, and $NH_3$ as a reaction gas, a film is formed by a single-frequency parallel-plate plasma CVD method. Thereby, even when the film forming temperature is made not more than an allowable temperature limit of an adhesive to adhere a support (for example, approximately 100° C. or less, which is an allowable temperature limit when the adhesive is an ultraviolet curing resin), a high-quality film without exfoliation in a CMP step of the following step and with less leakage can be formed. This high-quality film is, if being prescribed by a refractive index, a film whose refractive index with respect to a wavelength of 633 nm is approximately 1.8 through 1.9.

18 Claims, 7 Drawing Sheets

F I G. 5G
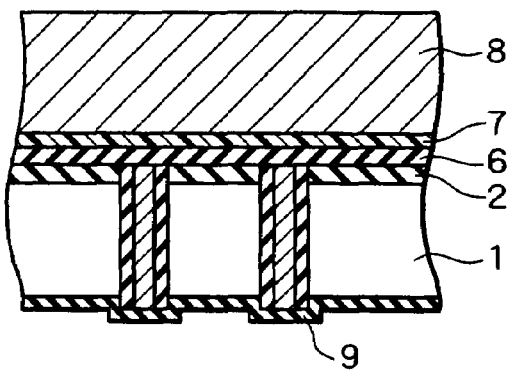
F I G. 5H
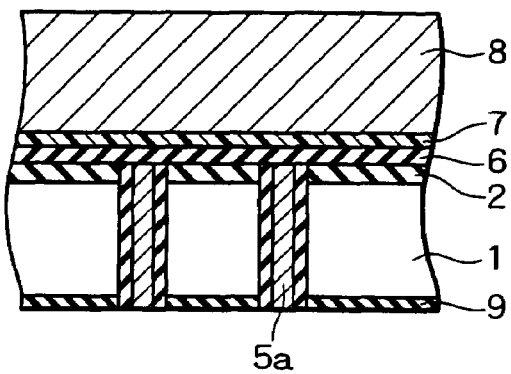
F I G. 5I
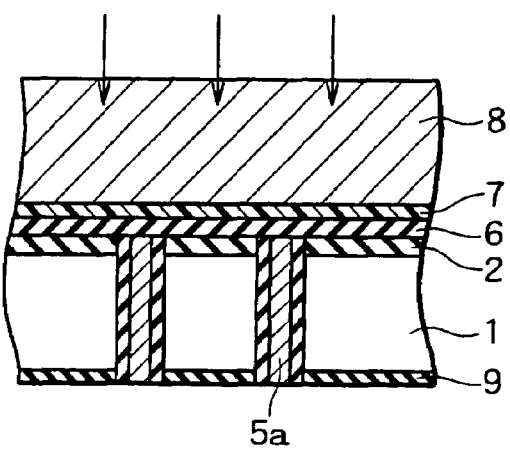

SEMICONDUCTOR DEVICE AND MANUFACTURING METHOD THEREOF

The present Application is a Divisional Application of U.S. patent application Ser. No. 11/047,576, filed on Feb. 2, 2005 now U.S. Pat. No. 7,291,911.

BACKGROUND OF THE INVENTION

1. Technical Field of the Invention

The present invention relates to a semiconductor device and manufacturing method thereof, and in particular to a semiconductor device wherein a structure of a silicon spacer for SiP (System in a Package) provided with conductive plugs penetrating through a substrate has been improved and a manufacturing method thereof.

2. Description of the Related Art

With the downsizing and advancement in performance of electronic appliances, downsizing and multifunctionality have been demanded for semiconductor devices to be mounted on electronic appliances as well. As methods for realizing multifunctionality of a semiconductor device, a method of planarly arranging a plurality of semiconductor chips and connecting these by TAB (tape automated bonding) and a method of laminating a plurality of semiconductor chips in the thickness direction for connection exist, wherein for realization of downsizing, the method of laminating semiconductor chips in the thickness direction is excellent.

Herein, when two semiconductor chips are laminated in the thickness direction, a method of forming electrodes on the respective semiconductor chips and opposing and adhering both semiconductor chips to each other via solder balls (so-called face-down bonding) or the like is used. While when three or more semiconductor chips are laminated, a semiconductor device provided with conductive plugs penetrating through a semiconductor substrate (a so-called silicon spacer) is used (for example, Japanese Published Unexamined Patent Application No. H10-223833 (Pages 5 to 12, FIG. 4)).

A prior-art semiconductor device described in this publicly known document will be described with reference to the drawings. First, as shown in FIG. 1A, on a silicon substrate 1 inside for which a desirable element has been formed in advance and on whose surface a first interlayer insulating film 10 of a silicon nitride film has been formed, a mask pattern 11 of a silicon oxide film is formed, and the first interlayer insulating film 10 and the silicon substrate 1 are etched by an RIE method using an Fluorine-based gas, whereby holes 4 with a predetermined depth penetrating through the first interlayer insulating film 10 are formed.

Next, as shown in FIG. 1B, by use of an LPCVD method, a silicon oxide film and a silicon nitride film are deposited in order on the entire surface of the silicon substrate 1, whereby a laminated insulating film 12 of a laminated structure is formed on the first interlayer insulating film 10 and on inner walls and bottom portions of the holes 4.

Next, as shown in FIG. 1C, by use of a CVD method, a sputtering method, a plating method and the like, after a conductive material such as W (tungsten), Mo (molybdenum) or the like to be conductive plugs is deposited on the entire surface of the silicon substrate 1 and the insides of the holes 4 are buried with the conductive material, by use of a CMP method, an etchback method or the like, the conductive material and laminated insulating film 12 are etched until the first interlayer insulating film 10 is exposed to form conductive plugs 5a.

Next, as shown in FIG. 1D, a multi-layer wiring structure 13 composed of metal wiring, an interlayer insulating film, plugs, etc., is formed on the silicon substrate 1. Thereafter, grooves are formed on the surface of the multi-layer wiring structure 13, and pads 14 are formed in these grooves.

Next, as shown in FIG. 1E, by use of CMP, chemical polishing, mechanical polishing, wet etching, dry etching, or the like, the surface on the side opposite (rear-surface side) to the surface on which the holes 4 have been formed is polished or ground until the laminated insulating film 12 on the bottom portions of the holes 4 is exposed.

Next, as shown in FIG. 1F, a silicon oxide film 15 is formed on the entire surface of the rear surface of the silicon substrate 1 by use of a plasma CVD method. At this time, if a low-temperature process is required, an SOG film is formed in place of the silicon oxide film 15, or if a reduction in stress which the silicon substrate 1 receives is demanded, an organic film such as a polyimide film is formed in place of the silicon oxide film 15.

Next, as shown in FIG. 1G, the silicon oxide film 15 and laminated insulating film 12 are polished by use of a CMP method until the conductive plugs 5a are exposed. Thereby, a semiconductor device (silicon spacer) wherein the conductive plugs 5a have been embedded in the through holes via the laminated insulating film 12 is completed.

As such, for forming a semiconductor device (silicon spacer) of the above-described structure, it is necessary, after forming the conductive plugs 5a on the front-surface side of the silicon substrate 1, to grind the rear-surface side of the silicon substrate 1 by a CMP method or the like, and furthermore, after forming the insulating film such as a silicon oxide film 15 on the rear-surface side, to grind the insulating film to expose the surfaces of the conductive plugs 5a. However, if the rear surface grinding and insulating film formation are carried out without reinforcing the silicon substrate 1, inconveniences occur such that the silicon substrate 1 is damaged and the properties of the element formed inside are changed, and moreover, workability is inferior. Therefore, normally, employed is a method wherein, after forming the conductive plugs 5a, a support composed of a glass substrate or the like is adhered to the front-surface side of the silicon substrate 1, grinding or polishing of the rear-surface side of the silicon substrate 1, formation of an insulating film, grinding or polishing of the insulating film are carried out, and thereafter, the support is removed.

However, since adhesives are generally easily affected by heat, when forming an insulating film on the rear-surface side of the silicon substrate 1 to which a support has been fixed by an adhesive, film forming temperature thereof must be lowered. Therefore, the formed insulating film is weak in mechanical strength, and inconveniences occur such that the insulating film is exfoliated in the CMP step of the insulating film for exposing the conductive plugs, and minute flaws called scratches are produced.

In addition, in the foregoing publicly known document, although there is a description to the effect that a coated film such as an SOG film is preferably used in place of the silicon oxide film 15 when a low-temperature process is required, since the SOG film is weak in mechanical strength of the film and adhesion to the silicon substrate 1 is also inferior, exfoliation eventually occurs in the CMP step. In addition, if the SOG film is merely baked at low temperature, since a dehydration/condensation reaction of the SOG is not sufficiently carried out, it results in a hygroscopic film with much leakage.

SUMMARY OF THE INVENTION

It is an object of the present invention to provide a method for manufacturing a semiconductor device capable of forming, at low temperature, a high-quality silicon insulating film which hardly exfoliates with less leakage on a silicon substrate, on which conductive plugs penetrating through the substrate are formed, and a semiconductor device manufactured by the same method.

A semiconductor device according to the present invention comprises a semiconductor chip provided with one or more conductive plugs penetrating through a semiconductor substrate, wherein on at least one surface of the semiconductor substrate, a silicon nitride film whose refractive index with respect to a wavelength of 633 nm is approximately 1.8 through 1.9 is formed.

In addition, a semiconductor device of the present invention comprises a plurality of semiconductor chips including the above-noted semiconductor chip and another semiconductor chip with electrodes formed at positions corresponding to the conductive plugs of the above-noted semiconductor chip, wherein the plurality of semiconductor chips are interconnected via the conductive plugs and laminated.

A method for forming a silicon insulating film on a front surface of a semiconductor substrate according to the present invention comprises the step of forming, on the front surface of the semiconductor substrate, a silicon nitride film by a single-frequency parallel-plate plasma CVD method by use of a mixed gas containing $SiH_4$, $NH_3$, and $N_2$ as a film forming gas.

In addition, a method for manufacturing a semiconductor device according to the present invention comprises the steps of:

forming, on one surface of a semiconductor substrate, conductive plugs;

fixing, to said one surface of the semiconductor substrate, a support member by use of an adhesive;

grinding or polishing the other surface of the semiconductor substrate until the conductive plugs are protruded;

forming, on said other surface of the semiconductor substrate, a silicon nitride film by a single-frequency parallel-plate plasma CVD method by use of a mixed gas containing $SiH_4$, $NH_3$, and $N_2$ as a film forming gas;

removing the silicon nitride film on the front surfaces of the conductive plugs; and detaching the support member from the semiconductor substrate.

In this method for manufacturing a semiconductor device, it is preferable that the forming of the conductive plugs comprises at least the steps of:

forming holes with a predetermined depth on one surface of the semiconductor substrate; and forming conductive plugs by burying a conductive material via an insulating film inside the holes.

In the present invention, for example, when forming a silicon nitride film to protect and insulate a surface on which a silicon substrate has been ground, by use of a mixed gas containing $SiH_4$, $NH_3$, and $N_2$ as a reaction gas, a film is formed by a single-frequency parallel-plate plasma CVD method, therefore, even when the film forming temperature is made approximately 100° C. or less, which is an allowable temperature limit of an adhesive to adhere a support, a high-quality film without exfoliation in a CMP step of the following step and with less leakage can be formed. That is, if being prescribed by a refractive index, a film whose refractive index with respect to a wavelength of 633 nm is approximately 1.8 through 1.9 can be formed.

Namely, according to the present invention, first, on a ground or polished substrate surface (rear surface) of a silicon spacer provided with conductive plugs penetrating through a substrate, a silicon nitride film can be formed at a low temperature of not more than 100° C., which is an allowable temperature limit of an adhesive to adhere a support. This is because the silicon nitride film is formed not by a two-frequency plasma CVD method but by a single-frequency parallel-plate plasma CVD method.

In addition, according to the present invention, a high-quality silicon nitride film without exfoliation in a CMP step after film formation and with less leakage can be formed. This is because, by forming a film by use of a mixed gas containing $SiH_4$, $NH_3$, and $N_2$ as a reaction gas, $SiH_4$ can be sufficiently nitrided even by use of a single-frequency parallel-plate plasma CVD method, and Si—Si bonds are hardly produced.

BRIEF DESCRIPTION OF THE DRAWINGS

FIG. 5A through FIG. 5J are sectional views showing a manufacturing method for a semiconductor device according to an embodiment of the present invention in order of the steps.

DETAILED DESCRIPTION OF THE PREFERRED EMBODIMENTS

Figure 1A:
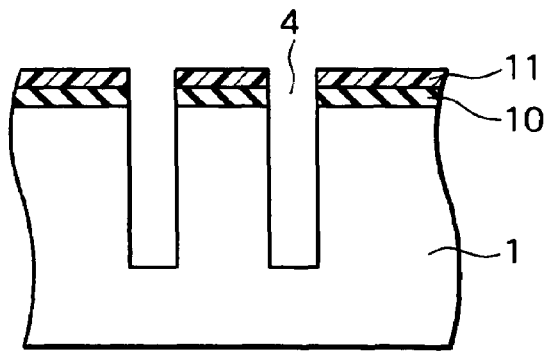
FIG. 1A through FIG. 1G are sectional views showing a prior-art manufacturing method for a semiconductor device in order of the steps.
Figure 1B:
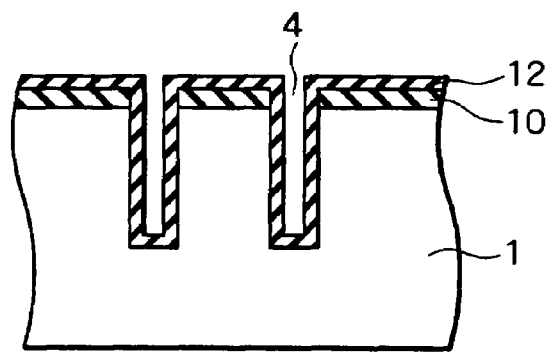
Figure 1C:
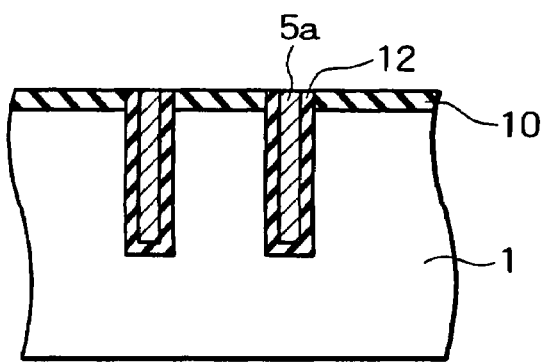
Figure 1D:
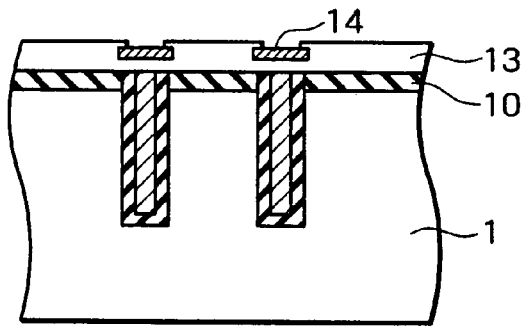
Figure 1E:
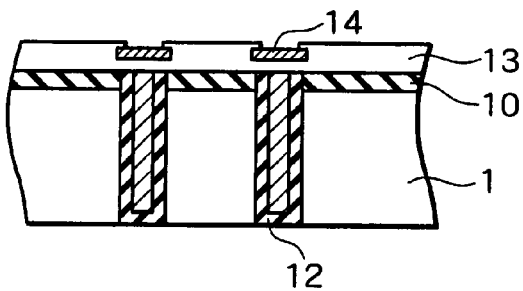
Figure 1F:
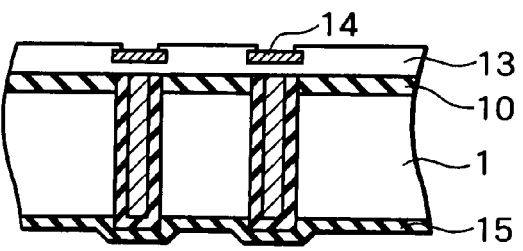
Figure 1G:
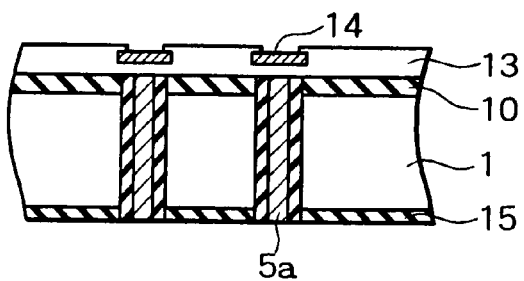

As shown in the prior art, as a method for realizing downsizing and multifunctionality of a semiconductor device, a method of laminating semiconductor chips by use of a silicon spacer provided with conductive plugs penetrating through a silicon substrate has been used, however, when the silicon spacer is formed, it is necessary, before grinding or the polishing the rear surface of the silicon substrate, to temporarily adhere a support to the front-surface side by an adhesive for reinforcement, and since the allowable temperature limit of this adhesive is low, that is, on the order of 100° C., the film forming temperature when forming an insulating film to protect and insulate the rear surface after grinding or polishing the silicon substrate cannot be high, and as a result, the insulating film becomes inferior in adhesion and exfoliates in the CMP step and scratches are produced, therein a problem has existed.

Herein, as the insulating film to be formed on the rear surface, a silicon nitride film excellent in mechanical strength is preferable, however, if a silicon nitride film is formed by a plasma CVD method while employing $SiH_4$ and $NH_3$ as a reaction gas, this easily results in a course film by an insufficient nitriding of $SiH_4$ and exfoliation in the CMP step cannot be suppressed, and in addition, if $SiH_4$ and $N_2$ are employed as a reaction gas, Si—Si bonds are easily produced, thus resulting in a film with much leakage. Furthermore, it has been reported that oxidation or moisture absorption occurs after film formation and O—H bonds are formed in the silicon nitride film if the film forming temperature is lowered to 70° C., and when a silicon nitride film with such film quality is used, if conductive plugs are formed by an easily oxidizable material such as Cu, the surfaces of the conductive plugs are oxidized, and inconveniences such as a connection failure and an increase in resistance occur.

Therefore, the inventor of the present invention has discovered, as a result of forming silicon nitride films with various conditions, that by forming a film by a parallel-plate plasma CVD method with a single frequency (for example, 13.56 MHz) by use of a triple mixed gas of $SiH_4$, $N_2$, and $NH_3$ as a reaction gas, the film forming temperature can be made 100° C. or less, and without exfoliation in the CMP step, a high-quality silicon nitride film with less leakage can be formed. In addition, it has been discovered that there is a close correlation between the film density and film composition and refractive index, and the reflective index can be used as an index to judge film characteristics, and a high-quality silicon nitride film can be obtained by forming a film with a condition where the reflective index becomes in a range of 1.8 through 1.9 with respect to a wavelength of 633 nm.

Here, although the respective reaction gases and parallel-plate plasma CVD method themselves are publicly known, it is a novel fact discovered by experimental knowledge of the inventor of the present invention that, by using a mixed gas containing $SiH_4$, $N_2$, and $NH_3$ as a reaction gas, $SiH_4$ can be sufficiently nitrided even by the single-frequency parallel-plate plasma CVD method and generation of Si—Si bonds can be suppressed, and that characteristics such as film density and film composition can be prescribed based on a refractive index as an index.

Figure 2:
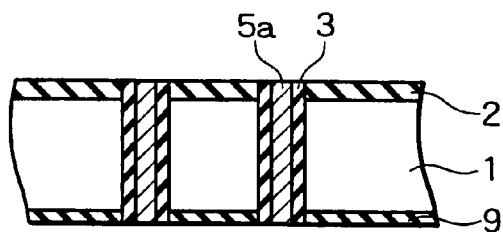
FIG. 2 is a sectional view schematically showing a structure of a semiconductor device according to an embodiment of the present invention.
Figure 3:
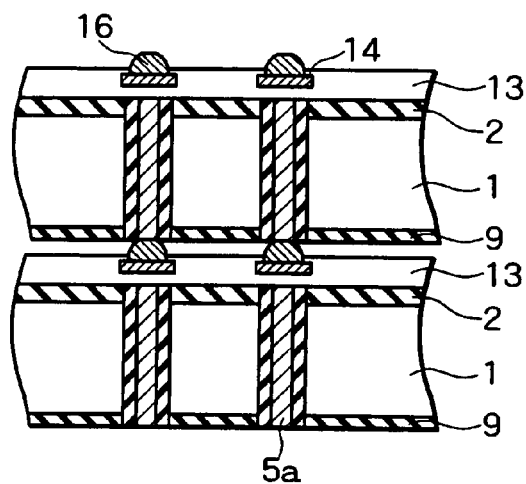
FIG. 3 is a sectional view showing a variation of the structure of a semiconductor device according to an embodiment of the present invention.
Figure 4:
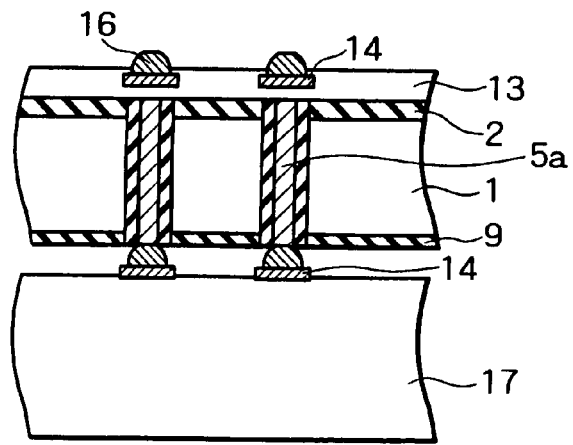
FIG. 4 is a sectional view showing a variation of the structure of a semiconductor device according to an embodiment of the present invention.

Hereinafter, an embodiment of the present invention will be described in detail. FIG. 2 is a sectional view schematically showing a structure of a semiconductor device of the present embodiment, and FIG. 3 and FIG. 4 are sectional views showing variations thereof. In addition, FIG. 5A through 5J are sectional views showing a manufacturing method for a semiconductor device according to the present embodiment, and FIG. 6 is a view for explaining a problem caused by a prior-art method.

As shown in FIG. 2, a semiconductor device of the present embodiment is used as a silicon spacer for SiP, and in this semiconductor device, one or more conductive plugs 5a penetrating through a semiconductor substrate such as a silicon substrate 1 are formed, and in regions, of the surface where the substrate is ground or polished (in the drawing, the lower surface, which is hereinafter referred to as a rear surface for the sake of convenience), excluding the conductive plugs 5a, a high-quality silicon nitride film 9 with less leakage has been formed without exfoliation in the CMP step. This silicon nitride film 9 is, if being prescribed by a refractive index, a film whose refractive index with respect to a wavelength of 633 nm is 1.8 through 1.9.

Here, this semiconductor device may be such a structure that only conductive plugs 5a to connect semiconductor chips disposed on both front and rear sides have been formed, or may be such a structure that unillustrated circuits, laminated wiring, etc., have been formed inside the semiconductor substrate and on a surface-layer portion. In addition, the semiconductor device of the present embodiment may be such a structure to be solely utilized, may be such a structure, as shown in FIG. 3, that a plurality of semiconductor devices have been laminated and connected via solder bumps 16 and pads 14 or the like therebetween, and moreover, it may be such a structure, as shown in FIG. 4, that another semiconductor chip 17 or the like on which pads 14 have been formed at positions corresponding to the conductive plugs 5a is connected.

Next, a method for manufacturing a semiconductor device of the above-described structure will be described with reference to the step sectional views of FIG. 5A through FIG. 5J.

Figure 5A:
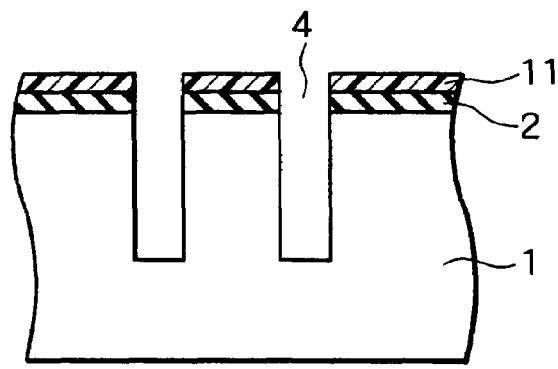
Figure 6:
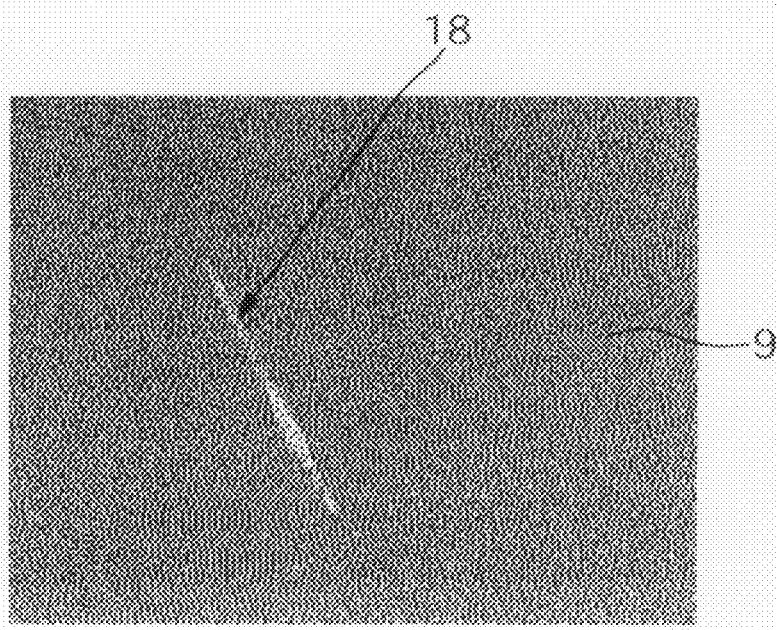
FIG. 6 is a view explaining a problem of a prior-art method, which is a microphotograph of a film where a scratch defect has been produced.

First, as shown in FIG. 5A, after forming, on a silicon substrate 1 on which desirable elements such as MOS transistors have been formed as necessary, a first insulating film 2 such as a silicon oxide film or a silicon nitride film by use of a CVD method, a plasma CVD method or the like, thereon, an antireflection film for suppressing an exposure reflection and a resist are coated, an exposure and development are carried out by use of a publicly known photolithography technique, whereby a mask pattern 11 to form holes 4 is formed. Here, in place of forming the mask pattern 11 by a resist, it may be possible to form a silicon nitride film on the silicon substrate 1 as shown in the prior art and form thereon a hard mask made of a silicon oxide film whose etching selectivity to the silicon nitride film is great.

Subsequently, holes 4 with a predetermined depth penetrating through the first insulating film 2 are formed by use of a publicly known etching technique. Here, the method for forming the holes 4 is not limited, either, and dry etching such as RIE, wet etching using an etchant, or a method combining dry etching and wet etching may be used. In addition, the depth and shape of the holes 4 are not limited, either, and the depth of the holes 4 may be set so as to become a final thickness of the semiconductor device, for example.

Figure 5B:
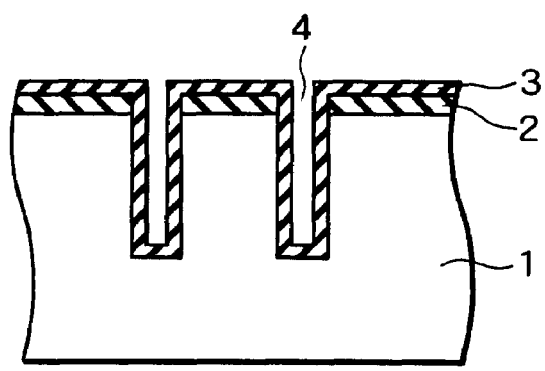

Next, after removing the resist and antireflection film by oxide plasma ashing, as shown in FIG. 5B, a silicon oxide film, a silicon nitride film, a laminated layer of these or the like is deposited on the entire surface of the substrate 1 by use of a CVD method, a plasma CVD method or the like, whereby a second insulating film 3 is formed on the silicon substrate 1 and on the inner walls and bottom portions of the holes 4.

Figure 5C:
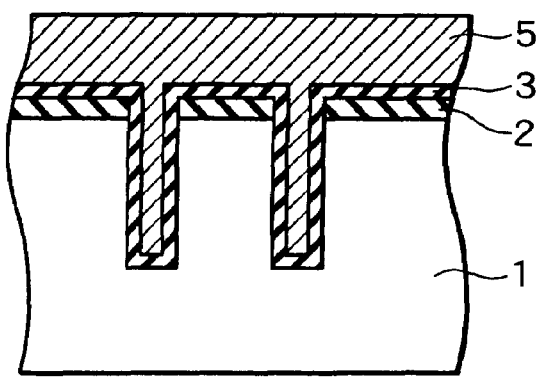

Next, as shown in FIG. 5C, by use of a sputtering method, after forming a barrier metal (not shown) composed of a monolayer film such as Ti, TiN, Ta, TaN, or WN or a laminated film of two layers or more by combining these and a Cu seed metal (not shown) to ease the plating growth of Cu, a conductive material 5 such as Cu is grown by an electrolytic plating method to bury the inside of the holes 4 with the conductive film.

Figure 5D:
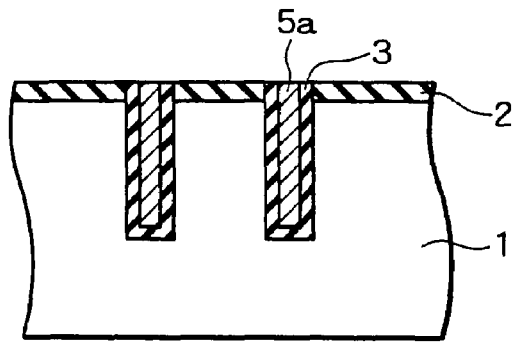

Next, as shown in FIG. 5D, the conductive material 5, barrier metal, and second insulating film 3 on the first insulating film 2 are removed by use of a CMP method, whereby conductive plugs 5a wherein the conductive material 5 has been embedded inside the holes 4 via the second insulating film 3 are formed. Here, steps up to here are the same as normal damascene processes, and an arbitrary method can be used to form conductive plugs 5a with a predetermined depth. For example, in place of Cu, tungsten or metal silicide may be formed by use of a CVD method or a sputtering method, or the conductive material 5 may be etched by use of an etch back method in place of the CMP method. In addition, only conductive plugs 5a may be formed in the semiconductor device, or after forming conductive plugs 5a, a multi-layer wiring structure 13 composed of metal wiring, an interlayer insulating film, plugs, etc., as shown in FIG. 2 may be formed on the front surface of the substrate.

Figure 5E:
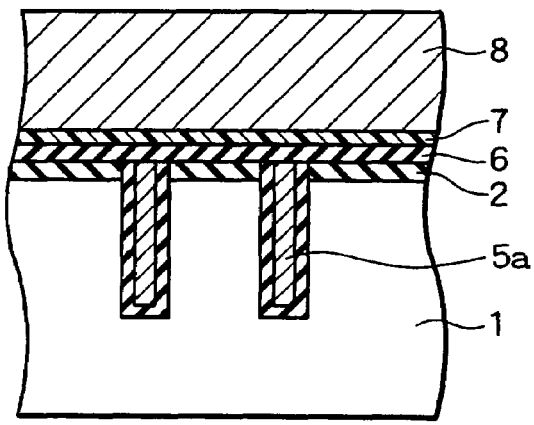

Next, grinding or polishing of the surface (rear surface) opposite to the surface of the silicon substrate 1 on which the conductive plugs 5a have been formed is to be carried out by use of a CMP method, and at this time, as described above, if the silicon substrate 1 is ground or polished in this condition as it is, the silicon substrate 1 may be damaged and the internally formed element may malfunction. Moreover, it is inconvenient in handling, therefore, a support 8 to reinforce the silicon substrate 1 is fixed to the front-surface side of the silicon substrate 1. Concretely, as shown in FIG. 5E, a coating film 6 made of resin and an adhesive such as an ultraviolet curing resin 7 hardened by ultraviolet rays are formed on the surface (front surface) of the silicon substrate 1 on which the conductive plugs 5a have been formed, thereon, a support 8 whose thickness is on the order of 700 μm made of a glass substrate, Pyrex® or the like is arranged, the ultraviolet curing resin 7 is hardened so that the support 8 is adhered and fixed to the silicon substrate 1.

Here, when a silicon spacer is fabricated, since it is necessary to remove the support 8 from the silicon substrate 1 after grinding of the rear surface of the silicon substrate 1, formation of a rear-surface-side insulating film, and grinding of the rear-surface-side insulating film are finished, it is necessary that the silicon substrate 1 and substrate 8 have structures removable later. Therefore, in the present embodiment, after a foaming coating film 6 is formed on the silicon substrate 1, an ultraviolet curing resin 7 to adhere the coating film 6 and support 8 is coated on the coating film 6, however, the method for fixing the support 8 is not limited to the above and any method can be employed as long as the support 8 can be securely fixed and can be easily removed in a later step.

Figure 5F:
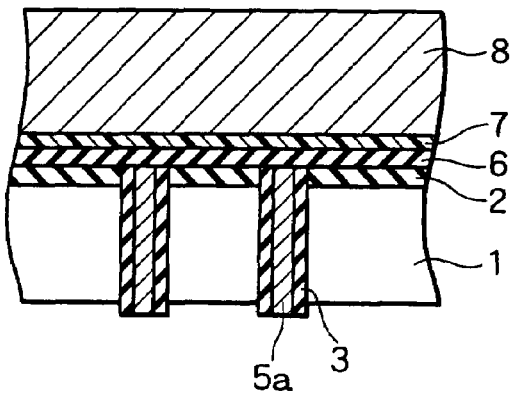

Next, as shown in FIG. 5F, the silicon substrate 1 reinforced by the support 8 is attached to the device, the rear surface of the silicon substrate 1 is ground by use of a CMP method until the conductive plugs 5a are protruded on the order of 500 nm from the rear surface of the silicon substrate 1.

Next, as shown in FIG. 5G, an insulating film is formed to protect and insulate the part where silicon has been exposed. At this time, generally, the insulating film is formed at high temperature as a high-quality film excellent in adhesion with less leakage, however, with the silicon spacer, since, after forming this insulating film, and furthermore, grinding or polishing to expose the conductive plugs 5a must be carried out, the support 8 cannot be separated at formation of the insulating film, therefore, it is necessary to form the insulating film at a low temperature not more than a temperature where the ultraviolet curing resin 7 is not decomposed or softened. In the present specification, temperature of the adhesive capable of fixing the support 8 is referred to as an allowable temperature limit, which is on the order of 100° C. for adhesives commercially available at present.

Herein, as the insulating film to be formed on the rear surface of the silicon substrate 1, a silicon nitride film excellent in mechanical strength is preferable, however, a bias cannot be applied to have the film forming temperature at a low temperature not more than approximately 100° C., as a result, a problem occurs such that the film is inferior in adhesion with the silicon substrate 1 and is easily exfoliated in the following CMP step. In addition, as a reaction gas for forming a silicon nitride film, normally, $SiH_4$ and $NH_3$ are used, if $NH_3$ is used, hydrogen atoms easily remain in the film, and in particular, if the film forming temperature is lowered, a coarse film weak in mechanical strength is formed, which is easily exfoliated in the CMP step. In addition, when $SiH_4$ and $N_2$ are used as a reaction gas, a two-frequency (for example, 13.56 MHz and 300 KHz to 500 KHz) plasma CVD method is employed to ease plasma generation, however, in the two-frequency plasma CVD method, particularly, the film forming temperature is raised to 100° C. or more by an ion bombardment as a result of ions following at a low frequency of 1 MHz or less, the ultraviolet curing resin 7 is decomposed or softened to detach the support 8, and moreover, with high-density plasma, Si—Si bonds are easily produced by a more activated reaction, and if the Si—Si bonds are formed, insulation of the silicon nitride film is deteriorated, thus resulting in a film where leakage easily occurs.

As such, it is difficult to form a silicon nitride film at low temperature, therefore, in a prior art, a silicon oxide film, an SOG, a polyimide film or the like has been employed, however, the inventor of the present invention has formed silicon nitride films with various conditions and has discovered that, by use of a triple mixed gas of $SiH_4$, $N_2$, and $NH_3$ as a reaction gas, by forming a film by a parallel-plate plasma CVD method with a single frequency (13.56 MHz), a high-quality silicon nitride film without exfoliation in the CMP step and with less leakage can be formed, and the film forming temperature can be made 100° C. or less.

In addition, for a quantitative evaluation of the mechanical strength and leakage of the silicon nitride film, a time consuming measurement such as a tension test and an electrical measurement must be carried out, however, the inventor of the present invention has discovered that there is a close correlation between the mechanical strength and leakage and refractive index, and characteristics of the silicon nitride film can be evaluated based on the reflective index, which can be easily measured by an optical method.

Accordingly, in the present embodiment, by use of a manufacturing condition (including a flow rate of the reaction gas, a degree of vacuum, a substrate temperature, etc.), where such a refractive index is obtained, a silicon nitride film 9 is formed so as to cover the conductive plugs 5a as shown in FIG. 5G. Here, although a triple mixed gas of $SiH_4$, $NH_3$, $N_2$ has been used in the present embodiment, it is sufficient, as the reaction gas, that the above-described three types of gases are included, and moreover, another type(s) of gas(es) may be added.

Next, as shown in FIG. 5H, the rear surface of the silicon substrate 1 on which the silicon nitride film 9 has been formed is ground polished by a CMP method or the like to expose the conductive plugs 5a. At this time, by the prior-art manufacturing method for a semiconductor device, since a silicon oxide film, an SOG film or the like which is weak in mechanical strength has been used, an inconvenience such as an exfoliation in the CMP step has occurred, and even when a silicon nitride film was used, the film has exfoliated owing to a low film forming temperature, and a defect such as a scratch 18 has occurred in the film, while in the present invention, since a high-quality silicon nitride film is formed with the above-described manufacturing condition, occurrence of such a problem can be avoided.

Figure 5J:
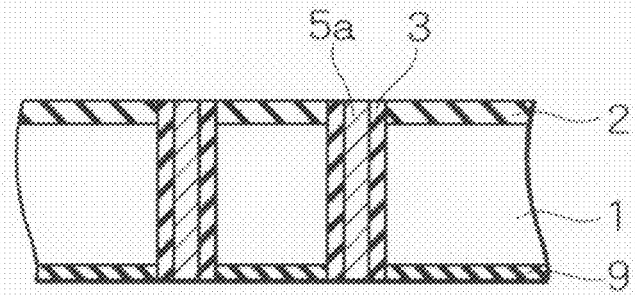

Next, as shown in FIG. 5I, the coating film 6 is foamed by irradiating laser beams from outside the support 8 to form a gap between the silicon substrate 1 and ultraviolet curing resin 7, whereby the support 8 is separated from the silicon substrate 1. And, by removing the coating film 6 and ultraviolet curing resin 7 remaining on the silicon substrate 1, a semiconductor device (silicon spacer) as shown in FIG. 5J is completed.

As such, by forming a silicon nitride film on the rear surface of the silicon spacer, in which one or more conductive plugs 5a penetrating through the substrate have been formed, by a single-frequency parallel-plate plasma CVD method by use of a mixed gas containing $SiH_4$, $NH_3$, and $N_2$ as a reaction gas, even when the film forming temperature is made approximately 100° C. or less, which is an allowable temperature limit of the adhesive, a high-quality silicon nitride film with a strong mechanical strength and less leakage, that is, if being prescribed by a refractive index, a film whose refractive index with respect to a wavelength of 633 nm is approximately 1.8 through 1.9 can be formed. Then, by a sole semiconductor chip on whose rear surface such a silicon nitride film has been formed or laminating the above-noted semiconductor chips, a semiconductor device with high connection reliability can be manufactured.

Next, in order to verify the effects of the present invention, a performed film forming test of silicon nitride films will be described. In order to prescribe a silicon nitride film without exfoliation in the CMP step and with less leakage by use of a refractive index, four types of silicon nitride films with different refractive indexes were formed with varied manufacturing conditions, and for the respective silicon nitride films, presence/absence of defects such as scratches was observed by use of a microscope and also spectrums were measured by use of an FTIR (fourier transform infrared spectroscopy), whereby presence/absence of Si—Si bonds was judged. The results are shown in Table 1.

TABLE 1

|  | reflactive index (633 nm) | | | |
| --- | --- | --- | --- | --- |
|  | 1.71 | 1.81 | 1.83 | 1.98 |
| scratch | existence | no existence | no existence | no existence |
| Si—Si bonds | no existence | no existence | no existence | existence |

From Table 1, in the film whose refractive index is 1.71 (wavelength 633 nm), a scratch 18 as shown in FIG. 6 was produced, thus it has been understood that the mechanical strength is weak and exfoliation in the CMP step cannot be suppressed in the film whose refractive index is small. In addition, in the film whose refractive index is 1.98 (wavelength 633 nm), although no scratch 18 was produced, Si—Si bonds were observed. A measurement of a leak current from this film showed 1 MV/cm of a 1 A/cm$^2$ level, thus it has been understood that leakage cannot be suppressed in the film whose refractive index is large. On the other hand, in the film whose refractive index is 1.81 and 1.83 (wavelength 633 nm), since no scratch 18 was produced or no Si—Si bonds were observed, it has been understood that this becomes a film with a strong mechanical strength and less leakage. Thereby, it has been discovered that, in order to form a silicon nitride film available in a silicon spacer, it is sufficient to form a film with a condition where the refractive index with respect to a wavelength 633 nm becomes in a range more than 1.71 and less than 1.98, and preferably, a range of approximately 1.8 through 1.9.

Here, in the above, although a description has been given of a case where the method for forming a silicon nitride film of the present invention was applied to a silicon spacer, the present invention is not limited to the embodiment but can also be similarly applied to an arbitrary semiconductor device for which formation of a silicon nitride film at low temperature is demanded and a manufacturing method thereof.

What is claimed is:

1. A method for forming silicon insulating film, on a front surface of a semiconductor substrate, comprising:
   forming, on the front surface of the semiconductor substrate, a silicon nitride film by a single-frequency parallel-plate plasma CVD method by use of a mixed gas comprising SiH$_4$, NH$_3$, and N$_2$ as a film forming gas.

2. A method for manufacturing a semiconductor device comprising the steps of:
   forming, on one surface of a semiconductor substrate, a conductive plug;
   fixing, to said one surface of the semiconductor substrate, a support member by use of an adhesive;
   one of grinding and polishing an other surface of the semiconductor substrate until the conductive plug is protruded;
   forming, on said other surface of the semiconductor substrate, a silicon nitride film, said silicon nitride film having a film forming temperature less than or equal to an allowable temperature limit of the adhesive for fixing the support member;
   removing said silicon nitride film on a front surface of said conductive plug; and
   detaching the support member from the semiconductor substrate.

3. The method for manufacturing a semiconductor device as set forth in claim 2, wherein said forming said conductive plug comprises the steps of:
   forming a hole with a predetermined depth on said one surface of said semiconductor substrate; and
   forming said conductive plug by burying a conductive material via an insulating film inside said hole.

4. The method for manufacturing a semiconductor device as set forth in claim 2, wherein the film forming temperature of said silicon nitride film is a temperature less than or equal to approximately 100° C.

5. The method for manufacturing a semiconductor device as set forth in claim 2, wherein said silicon nitride film is formed by a single-frequency parallel-plate plasma CVD method by use of a mixed gas comprising SiH$_4$, NH$_3$, and N$_2$ as a film forming gas.

6. The method for manufacturing a semiconductor device as set forth in claim 3, wherein said silicon nitride film is formed by a single-frequency parallel-plate plasma CVD method by use of a mixed gas comprising SiH$_4$, NH$_3$, and N$_2$ as a film forming gas.

7. The method for forming a silicon insulating film as set forth in claim 1, wherein a film forming temperature of said silicon nitride film is a temperature less than or equal to approximately 100° C.

8. The method for forming the silicon insulating film according to claim 1, further comprising:
   one of grinding and polishing said front surface of the semiconductor substrate until a conductive plug is protruded.

9. The method for forming the silicon insulating film according to claim 1, further comprising:
   forming said silicon nitride on the front surface; and
   removing said silicon nitride film on a front surface of a conductive plug.

10. The method for forming the silicon insulating film according to claim 1, further comprising:
    one of grinding and polishing said front surface of the semiconductor substrate until a conductive plug is protruded;
    forming said silicon nitride on the front surface; and
    removing said silicon nitride film on a front surface of the conductive plug.

11. The method for forming the silicon insulating film according to claim 1, further comprising:
    forming wiring inside the semiconductor substrate and on said front surface.

12. The method for forming the silicon insulating film according to claim 1, further comprising:
    forming a hole with a predetermined depth on an other surface of said semiconductor substrate that said front surface; and
    forming a conductive plug by burying a conductive material via an insulating film inside said hole.

13. A method of manufacturing a semiconductor device comprising:
   forming a conductive plug on a first surface of a semiconductor substrate;
   using an adhesive to fix a support member to said first surface of the semiconductor substrate;
   one of grinding and polishing a second surface of the semiconductor substrate until the conductive plug protrudes from the second surface;
   forming a silicon nitride film on the second surface, said silicon nitride film having a film forming temperature of less than or equal to an allowable temperature limit of the adhesive for fixing the support member;
   removing said silicon nitride film on a front surface of the conductive plug; and
   detaching the support member from the semiconductor substrate.

14. The method of manufacturing a semiconductor device as set forth in claim 13, wherein said forming said conductive plug comprises:
   forming a hole with a predetermined depth on said first surface of said semiconductor substrate; and
   forming said conductive plug by burying a conductive material via an insulation film inside said hole.

15. The method of manufacturing a semiconductor device as set forth in claim 13, wherein the film forming temperature of said silicon nitride film is a temperature less than or equal to approximately 100° C.

16. The method of manufacturing a semiconductor device as set forth in claim 13, wherein said silicon nitride film is formed by a single-frequency parallel-plate plasma CVD method using a film forming gas mixture comprising $SiH_4$, $NH_3$, and $N_2$.

17. The method of manufacturing a semiconductor device as set forth in claim 14, wherein said silicon nitride film is formed by a single-frequency parallel-plate plasma CVD method using a film forming gas mixture comprising $SiH_4$, $NH_3$, and $N_2$.

18. The method of forming the silicon insulating film according to claim 1, wherein a single frequency in the single-frequency parallel-plate plasma CVD method is greater than 1 MHz.

* * * * *